US008604429B2

(12) United States Patent
Yaguchi et al.

(10) Patent No.: US 8,604,429 B2
(45) Date of Patent: Dec. 10, 2013

(54) ELECTRON BEAM DEVICE AND SAMPLE HOLDING DEVICE FOR ELECTRON BEAM DEVICE

(75) Inventors: Toshie Yaguchi, Omitama (JP);
Yasuhira Nagakubo, Hitachinaka (JP);
Takeo Kamino, Hitachinaka (JP); Akira Watabe, Ibaraki (JP)

(73) Assignee: Hitachi High-Technologies Corporation, Tokyo (JP)

( * ) Notice: Subject to any disclaimer, the term of this patent is extended or adjusted under 35 U.S.C. 154(b) by 170 days.

(21) Appl. No.: 13/201,820

(22) PCT Filed: Jan. 20, 2010

(86) PCT No.: PCT/JP2010/000282
§ 371 (c)(1),
(2), (4) Date: Aug. 16, 2011

(87) PCT Pub. No.: WO2010/092747
PCT Pub. Date: Aug. 19, 2010

(65) Prior Publication Data
US 2011/0303845 A1 Dec. 15, 2011

(30) Foreign Application Priority Data
Feb. 16, 2009 (JP) .................................. 2009-032124

(51) Int. Cl.
*H01J 37/08* (2006.01)
*H01J 37/18* (2006.01)

(52) U.S. Cl.
USPC . 250/310; 250/306; 250/440.11; 250/441.11; 250/442.11

(58) Field of Classification Search
USPC ................ 250/306, 310, 311, 440.11, 441.11
See application file for complete search history.

(56) References Cited

U.S. PATENT DOCUMENTS

| 5,326,971 | A | 7/1994 | Theodore et al. |
| 7,906,762 | B2 * | 3/2011 | Bierhoff et al. ............... 250/310 |

(Continued)

FOREIGN PATENT DOCUMENTS

| JP | 47-24960 | 10/1972 |
| JP | 51-000267 | 1/1976 |

(Continued)

OTHER PUBLICATIONS

Extended European Search Report issued in European Patent Application No. EP 10741027.6 dated Dec. 11, 2012.

*Primary Examiner* — Jack Berman
*Assistant Examiner* — Johnnie L Smith
(74) *Attorney, Agent, or Firm* — McDermott Will & Emery LLP

(57) ABSTRACT

An object of the invention is to provide an electron beam device and a sample holding device for the electron beam device that can observe the reaction between a sample and a gas at high resolution while a gas atmosphere is maintained even by using thin diaphragms.

To solve one of the problems described above, in an electron beam device having the function of separately exhausting an electron beam irradiation portion of an optical column, a sample chamber and an observation chamber, a gas supply means for supplying a gas to a sample and an exhaust means for exhausting a gas are provided to sample holding means, diaphragms are disposed above and below the sample to separate the gas atmosphere and vacuum of the sample chamber and to constitute a cell sealing the atmosphere around the sample, and a mechanism for spraying a gas is provided to the outside of the diaphragms. The gas sprayed outside the diaphragms has low electron beam scattering performance such as hydrogen, oxygen or nitrogen. The diaphragm is an amorphous film formed of a light element such as a carbon film, an oxide film and a nitride film capable of transmitting the electron beam.

12 Claims, 14 Drawing Sheets

(56) References Cited

U.S. PATENT DOCUMENTS

| | | | |
|---|---|---|---|
| 2010/0243888 A1* | 9/2010 | Nishiyama et al. | 250/307 |
| 2011/0133083 A1* | 6/2011 | Bierhoff et al. | 250/310 |
| 2012/0120226 A1* | 5/2012 | de Jonge | 348/80 |
| 2012/0305769 A1* | 12/2012 | Yaguchi et al. | 250/310 |

FOREIGN PATENT DOCUMENTS

| | | |
|---|---|---|
| JP | 2-22559 | 2/1990 |
| JP | 9-129168 | 5/1997 |
| JP | 2000-133186 | 5/2000 |
| JP | 2000-208083 | 7/2000 |
| JP | 2001-305028 | 10/2001 |
| JP | 2003-115273 A | 4/2003 |
| JP | 2003-187735 | 7/2003 |
| JP | 2005-190864 | 7/2005 |
| JP | 2007-294328 A | 11/2007 |
| JP | 2008-108429 | 5/2008 |
| JP | 2008-288161 A | 11/2008 |
| JP | 2009-117196 | 5/2009 |
| WO | WO-02/45125 A1 | 6/2002 |

* cited by examiner

FIG.13
(a)
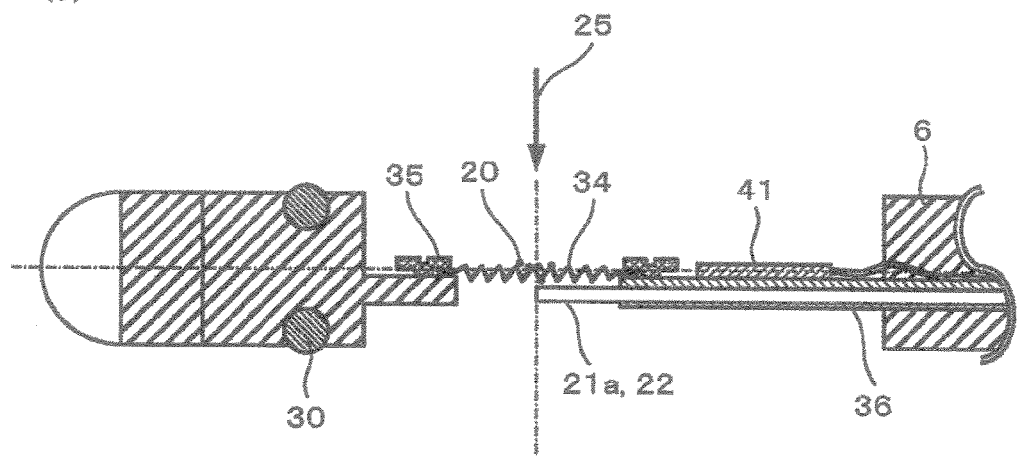
(b)
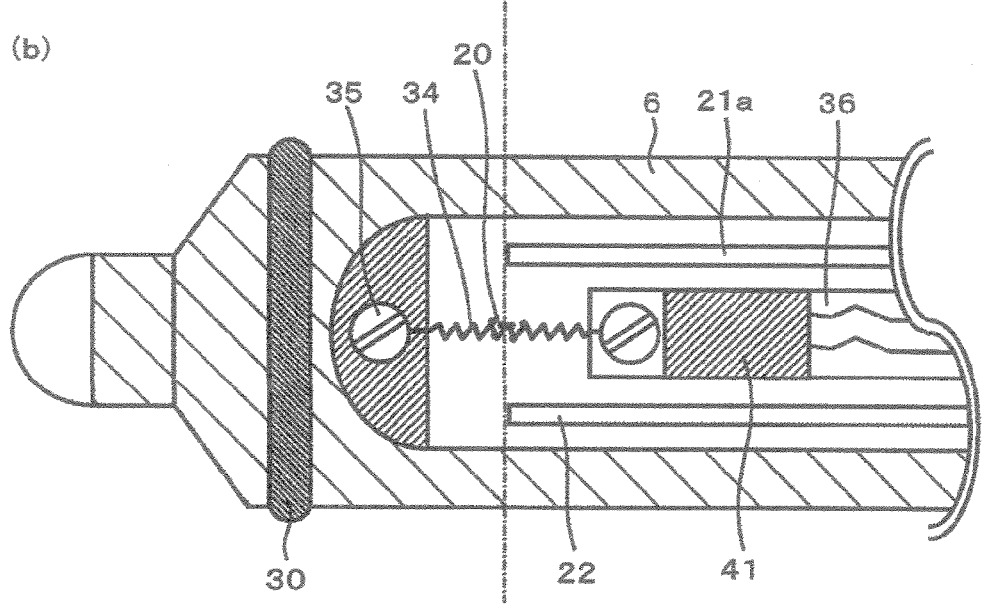

ELECTRON BEAM DEVICE AND SAMPLE HOLDING DEVICE FOR ELECTRON BEAM DEVICE

RELATED APPLICATIONS

This application is the U.S. National Phase under 35 U.S.C. §371 of International Application No. PCT/JP2010/000282, filed on Jan. 20, 2010, which in turn claims the benefit of Japanese Application No. 2009-032124, filed on Feb. 16, 2009, the disclosures of which Applications are incorporated by reference herein.

TECHNICAL FIELD

This invention relates to an electron beam device for observing a sample by using electron beams and a sample holding device for such an electron beam device. More particularly, the invention relates to an electron beam device capable of conducting high resolution observation and high sensitivity analysis of a sample during reaction process in a high pressure gas atmosphere and immediately after the reaction by creating a minute gas space (atmospheric cell) of an atmospheric gas embracing the sample with diaphragms inside a sample chamber and precisely controlling the pressure inside the atmospheric cell, and a sample holding device for such an electron beam device.

BACKGROUND ART

In an electron beam device, a method for observing the change of a sample by heating the sample to a high temperature or cooling it is known besides a method for observing the sample at room temperature. In order to bring the condition closer to a practical condition, there is also a method that observes the change in a reaction gas atmosphere.

As for the observation in the gas atmosphere, methods are known that sandwich a sample between two grids and furnish a sample holder with a mechanism for introducing and exhausting a gas into and out from the grids as described in Patent Literatures 1 and 2. As described in Patent Literature 3, there is also known a method that arranges a cylindrical cover around a sample and forms two holes in the cover to which diaphragms transmitting the electron beams are bonded.

In conjunction with an electron microscope for observing on the real time basis the reaction of a sample under a high temperature specific atmosphere condition, Patent Literature 4 describes a method for observing various reactions by forming in a sample holder a sample chamber isolated from vacuum by a diaphragm for holding the sample in air-tight, a pipe for introducing a gas into the sample chamber and a sample heating mechanism, and heating the sample while it is kept under a specific atmosphere condition.

As described in Patent Literature 5, there is further known a method that a capillary tube for blowing a gas is disposed opposing a heater for heating a sample and observes a gas reaction at a high temperature.

As another prior art, Patent Literature 6 describes a method that a coolant basin storing therein a coolant for cooling a sample is disposed around a sample holding unit and cools the sample and then observes it.

As still another prior art, Patent Literatures 7, 8 and 9 disclose a transmission electron microscope observation method. A heating mechanism for heating a sample and a mechanism for rapidly cooling it by blowing a gas to a reaction portion are provided to a charged particle beam apparatus and after the reaction process is observed, the observation portion is carved out by a focused ion beam.

CITATION LIST

Patent Literature

Patent Literature 1: JP-A-2000-133186
Patent Literature 2: JP-A-9-129168
Patent Literature 3: U.S. Pat. No. 5326971
Patent Literature 4: JP-A-51-267
Patent Literature 5: JP-A-2003-187735
Patent Literature 6: JP-A-2000-208083
Patent Literature 7: JP-A-2001-305028
Patent Literature 8: JP-A-2005-190864
Patent Literature 9: JP-A-2008-108429

SUMMARY OF INVENTION

Technical Problem

Because the gas atmosphere and vacuum are isolated and the gas reaction of the sample is observed, the prior art technologies described above do not consider the protection of the diaphragm through which the electron beam passes and there remains the problem that the diaphragm is broken in the observation at a high pressure. When a thick diaphragm is used to prevent the breakage, the image gets dim because the electron beam is scattered.

It is an object of the invention to provide an electron beam device capable of observing at high resolution the reaction between a sample and a gas under the state in which a gas atmosphere is maintained even when a thin diaphragm is used, and a sample holding device for such an electron beam device.

Solution to Problem

To solve one of the problems described above, in an electron beam device having the function of exhausting separately an electron beam irradiation portion of an optical column, a sample chamber and an observation chamber, the invention furnishes a sample holding means with a gas supply means for supplying a gas to a sample and an exhaust means for exhausting the gas, arranges diaphragms above and below the sample to isolate a gas atmosphere and the vacuum of the sample chamber and to constitute a cell sealing the atmosphere around the sample, and further provides a mechanism inside the sample chamber for spraying a gas to the outside of the diaphragms.

As the gas sprayed to the outside of the diaphragms, a gas having low electron beam scattering ability such as hydrogen, oxygen or nitrogen is used.

The material of the diaphragms is an amorphous film formed of a light element such as a carbon film, an oxide film and a nitride film each transmitting an electron beam.

Advantageous Effects of Invention

According to the invention, the minute gas space (atmospheric cell) of the atmospheric gas embracing the sample with the diaphragm is formed inside the sample chamber by using the electron beam device and the reaction between the sample and the gas can be observed with high resolution under the state where the gas atmosphere is maintained even by using the thin diaphragms.

BRIEF DESCRIPTION OF DRAWINGS

FIG. 13 illustrates a sample holding device 6 for an electron beam device according to an embodiment; (a) a sectional view of the sample holding device 6 for the electron beam device, and (b) a top view of the sample holding device 6 for the electron beam device.

DESCRIPTION OF EMBODIMENTS

Figure 1:
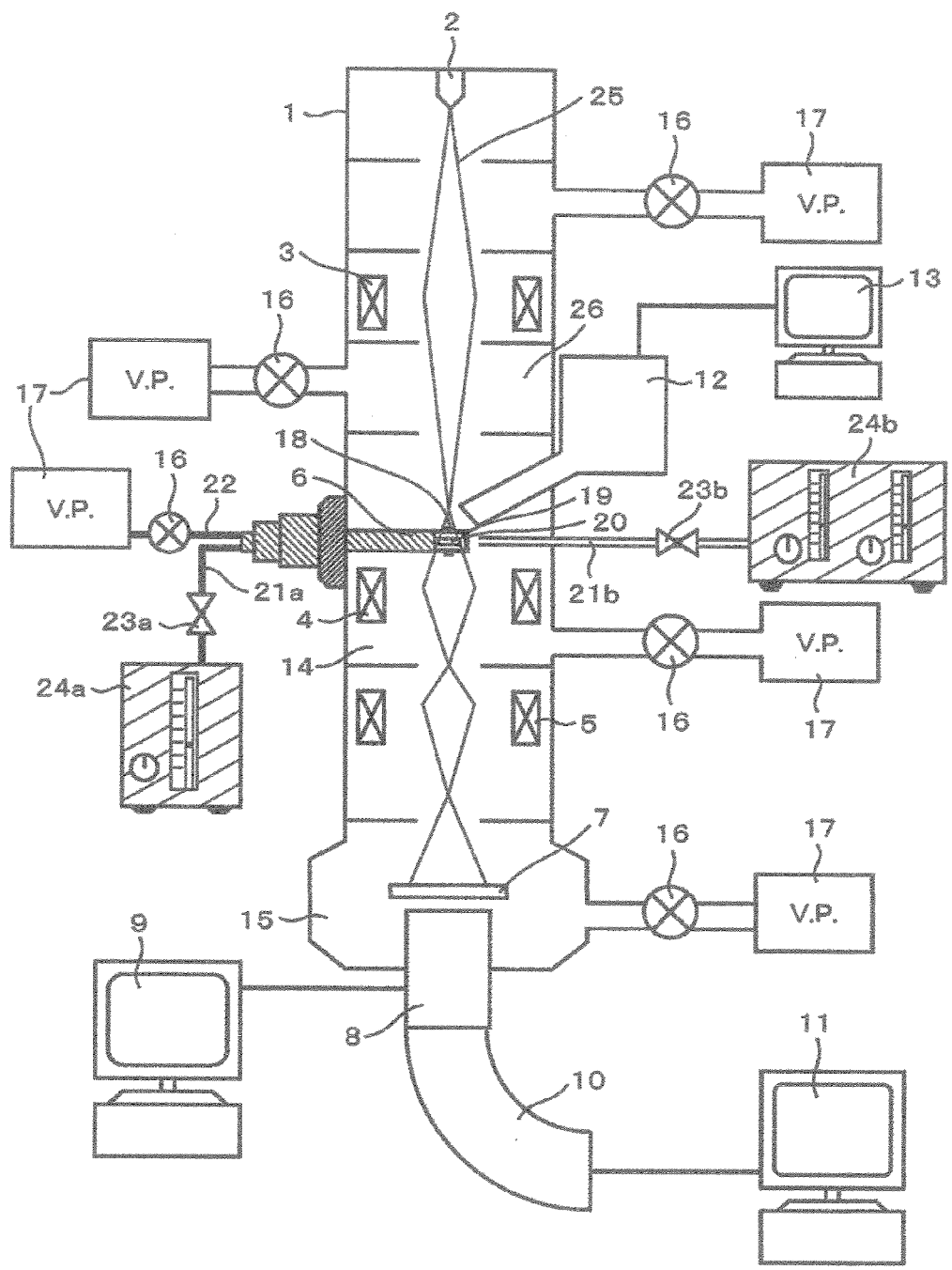
FIG. 1 is a basic structural view of an electron beam device 1 and an sample holding device 6 for the electron beam device according to an embodiment of the invention.

FIG. 1 is a basic structural view of an electron beam device 1 and a sample holding device 6 for the electron beam device according to an embodiment of the invention. An optical column of the electron beam device 1 has an electron gun 2, a condenser lens 3, an objective lens 4 and a projection lens 5. A sample holding device 6 for the electron beam device is interposed between the condenser lens 3 and the objective lens 4. A fluorescent plate 7 is arranged below the projection lens 5 and a TV camera 8 is arranged below the fluorescent plate 7. The TV camera 8 is connected to an image display unit 9. An EELS detector 10 is attached to a lower part of the TV camera 8 and is connected to an EELS control unit 11. An EDX detector 12 is installed above the sample holding device 6 for the electron beam device and is connected to an EDX control unit 13.

The electron gun 2, the condenser lens 3, an electron beam sample chamber 14 and an observation chamber 15 are connected to mutually different vacuum pumps 17 through valves 16, respectively. In the sample holding device 6 for the electron beam device, a sample 20 is loaded into a cell 19 sealed by a diaphragm 18 formed of an amorphous material of carbon, oxide or nitride. A distal end of a gas inlet pipe 21 and a distal end of a gas exhaust pipe 22 are inserted into the cell 19.

A gas inlet pipe 21a is connected to a gas storage unit 24a through a gas pressure controlling valve 23a. The gas exhaust pipe 22 is connected to a vacuum pump 17 through a valve 16. A distal end of the gas inlet pipe 21b is inserted into the electron beam sample chamber 14 so that a gas can be blown to an outside of the cell of a diaphragm portion 18 and is connected to a gas storage unit 24b through a gas pressure controlling valve 23b.

The electron beams 25 generated from the electron gun 2 are condensed by the condenser lens 3 and are irradiated to the sample 20. The electron beams 25 passing through the sample 20 are subjected to image formation by the objective lens 4 and are enlarged and projected onto the fluorescent plate 7 by the projection lens 5. Alternatively, the fluorescent plate 7 is lifted up, the electron beams are projected to the TV camera 8 and the transmission image is displayed on the image display unit 9.

Figure 2:
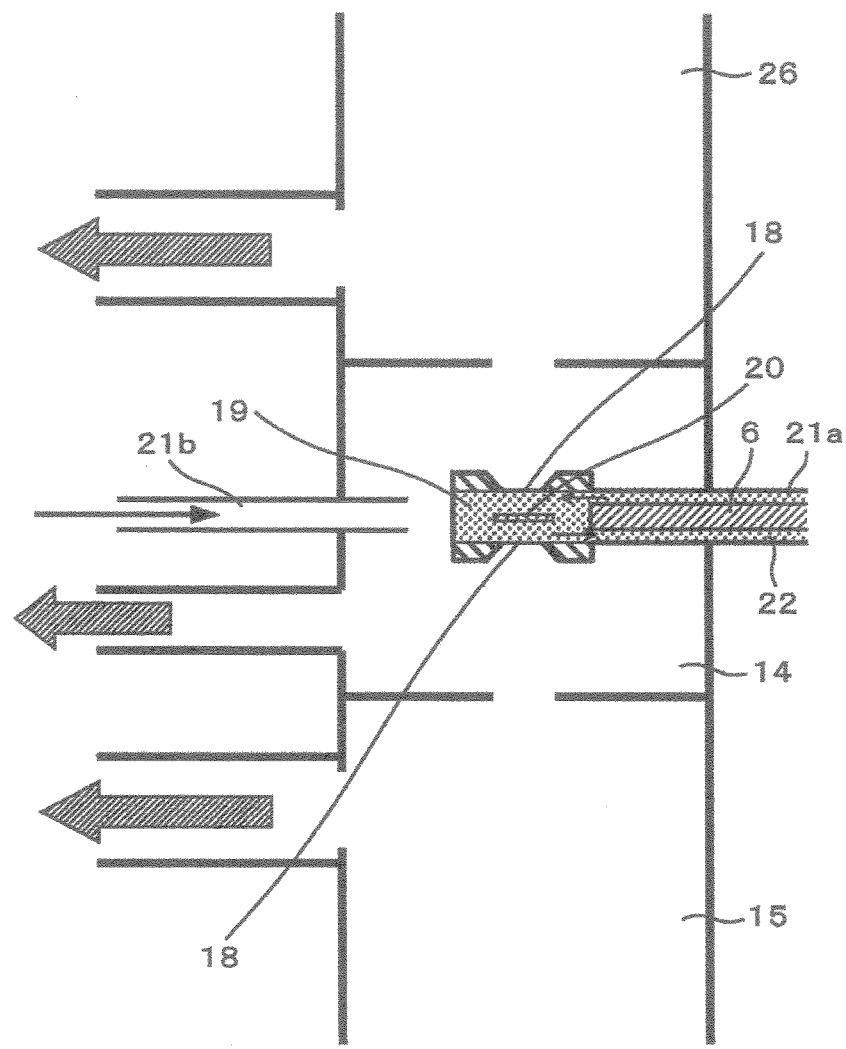
FIG. 2 is a structural view of an electron beam sample chamber 14 and a sample holding device 6 for the electron beam device according to an embodiment.

FIG. 2 illustrates a structural view of the electron beam sample chamber 14 and a partially enlarged view of the sample holding device 6 for the electron beam device according to one embodiment. The gas pressure inside the cell 19 from the gas inlet pipe 21a is regulated by the gas pressure controlling valve 23a and the sample 20 inside the gas is observed. The gas inside the cell 19 is exhausted by the vacuum pump 17 through the gas exhaust pipe 22.

In this instance, the pressure difference between the inside and outside of the cell 19 is reduced by blowing the gas from the gas inlet pipe 21b to the electron beam sample chamber 14 to protect the diaphragm 18. In this way, breakage of the diaphragm 18 is prevented even when the pressure inside the cell 19 is set to a higher level.

An intermediate chamber 26 partitioned by walls having a stop is formed between the electron beam sample chamber 14 and the electron gun 2. When exhaust is made by a different vacuum pump 17, it is possible to prevent the gas from directly reaching and breaking the electron gun 2.

The diaphragm is made of a light element such as a carbon film, an oxide film or a nitride film capable of transmitting the electron beam.

A gas having low electron beam scattering ability such as hydrogen, oxygen or nitrogen is used as the gas to be jetted to the outside of the diaphragm.

Figure 3:
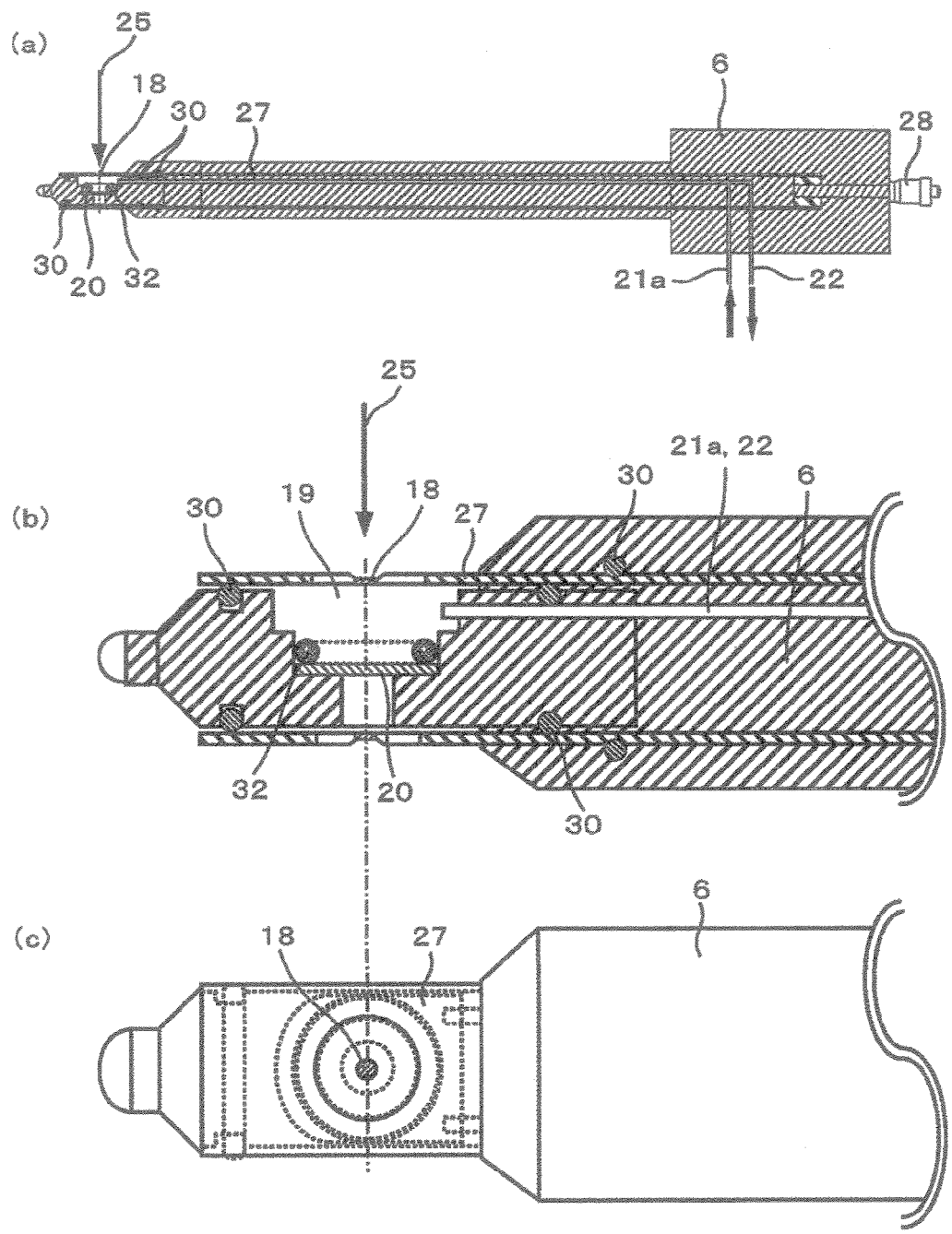
FIG. 3 is a structural view of a sample holding device 6 for an electron beam device according to an embodiment; (a) an overall sectional view of the sample holding device 6 for the electron beam device, (b) a distal end sectional view of the sample holding device 6 for the electron beam device, and (c) a distal end top view of the sample holding device 6 for the electron beam device.

FIG. 3 illustrates an overall sectional view (a), a distal end sectional view (b) and a distal end top view (c) of the sample holding device 6 for an electron beam device capable of moving the diaphragm horizontally according to an embodiment. The diaphragm 18 is attached to a diaphragm driving unit 27. The diaphragm driving unit 27 is connected to a micrometer 28 disposed outside the optical column of the electron beam device 1. The diaphragm driving unit 27 can be driven in the horizontal direction when the micrometer 28 is rotated. The sample 20 has a form in which it is fixed to a grid having a diameter of about 3 mm or is punched out into a disc having a diameter of about 3 mm and is fixed into the cell 19 by a ring spring 32. An O-ring 30 is interposed between the diaphragm driving unit 27 and the main body of the sample holding device 6 for the electron beam device. When the diaphragm driving unit 27 is set in such a manner that the diaphragm 18 is arranged at the electron beam passage portion, the atmosphere inside the cell 19 can be isolated from the outside. The gas is introduced into the cell 19 through the gas inlet pipe 21a and the sample 20 can be observed in the gas atmosphere.

An embodiment wherein the diaphragm is movable will be explained with reference to FIG. 4.

The prior art does not consider the operation of the diaphragm portion, and EDX analysis and EELS analyses of the sample after the reaction are not possible. In addition, there has been a problem that the exchange of gas atmosphere for the reaction cannot be conducted in a short time.

Figure 4:
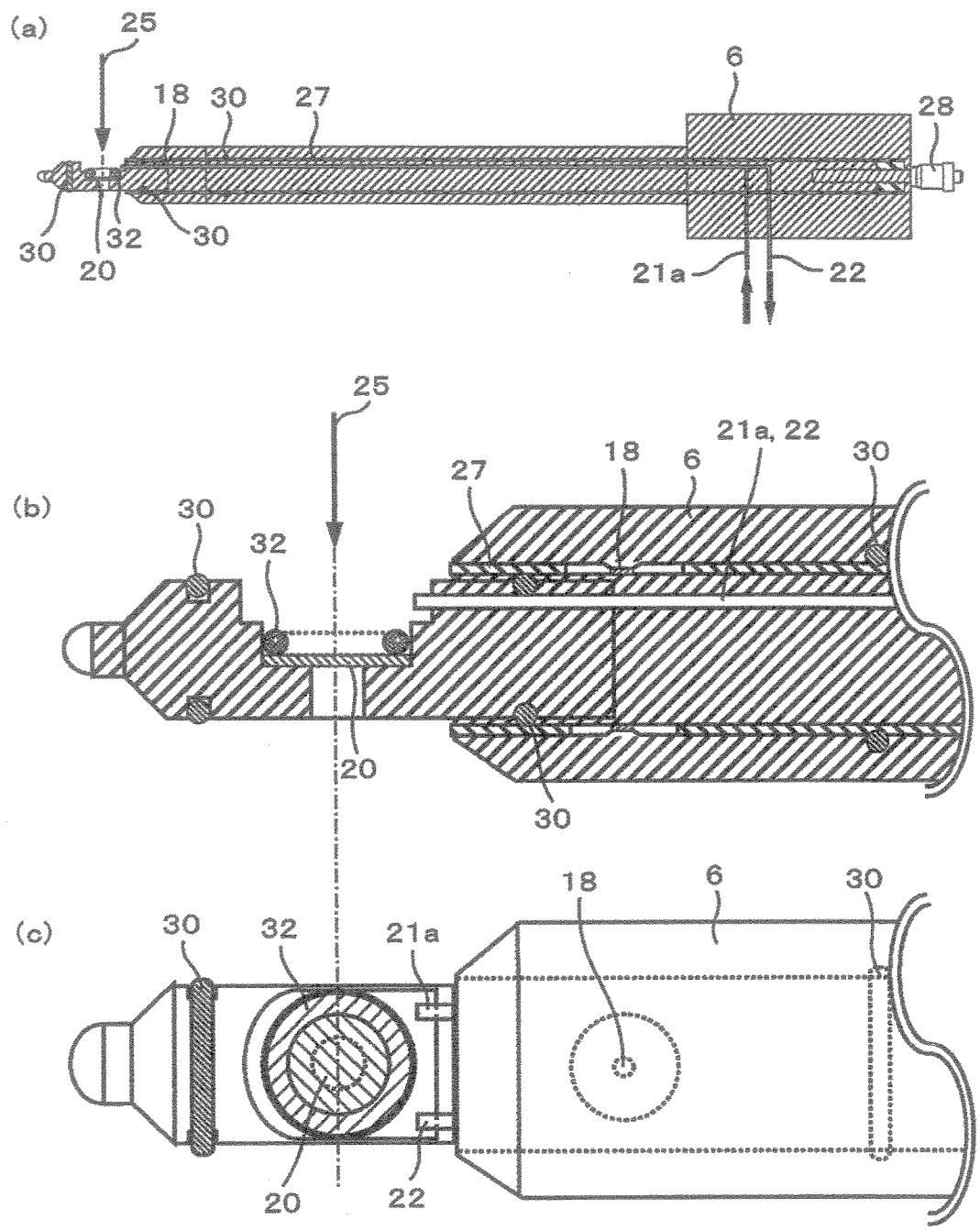
FIG. 4 is an explanatory view of the operation of the sample holding device 6 for an electron beam device according to an embodiment; (a) an overall sectional view of the sample holding device 6 for the electron beam device, (b) a distal end sectional view of the sample holding device 6 for the electron beam device, and (c) a distal end top view of the sample holding device 6 for the electron beam device.

FIG. 4 illustrates an overall sectional view (a) of the sample holding device 6 for the electron beam device when the diaphragm driving unit 27 is moved to open the cell 19 according to an embodiment, its distal end sectional view (b) and its distal end top view (c). Opening of the cell 19 can be made by rotating the micrometer 28 from outside the optical column of the electron beam device 1, and gas exhaust inside the cell 19 after the gas reaction can be conducted in a short time. High resolution transmission image observation, EDX analysis and EELS analysis that have been impeded by the diaphragm 18 and the gas can be thereafter conducted quickly without losing the visual field.

FIG. 4 illustrates a structure in which the upper and lower diaphragms 18 move simultaneously but the micrometer 18 may well be adapted so that either one or both of the diaphragms 18 move discretely in the horizontal direction.

Another embodiment in which the diaphragm is movable in the vertical direction will be explained with reference to FIG. 5.

Because the prior art does not consider the adjustment of the distance between the gas space and the sample, there has remained a problem that high resolution observation is difficult owing to scattering of the electron beams by the gas when the gas pressure in the cell is high.

Figure 5:
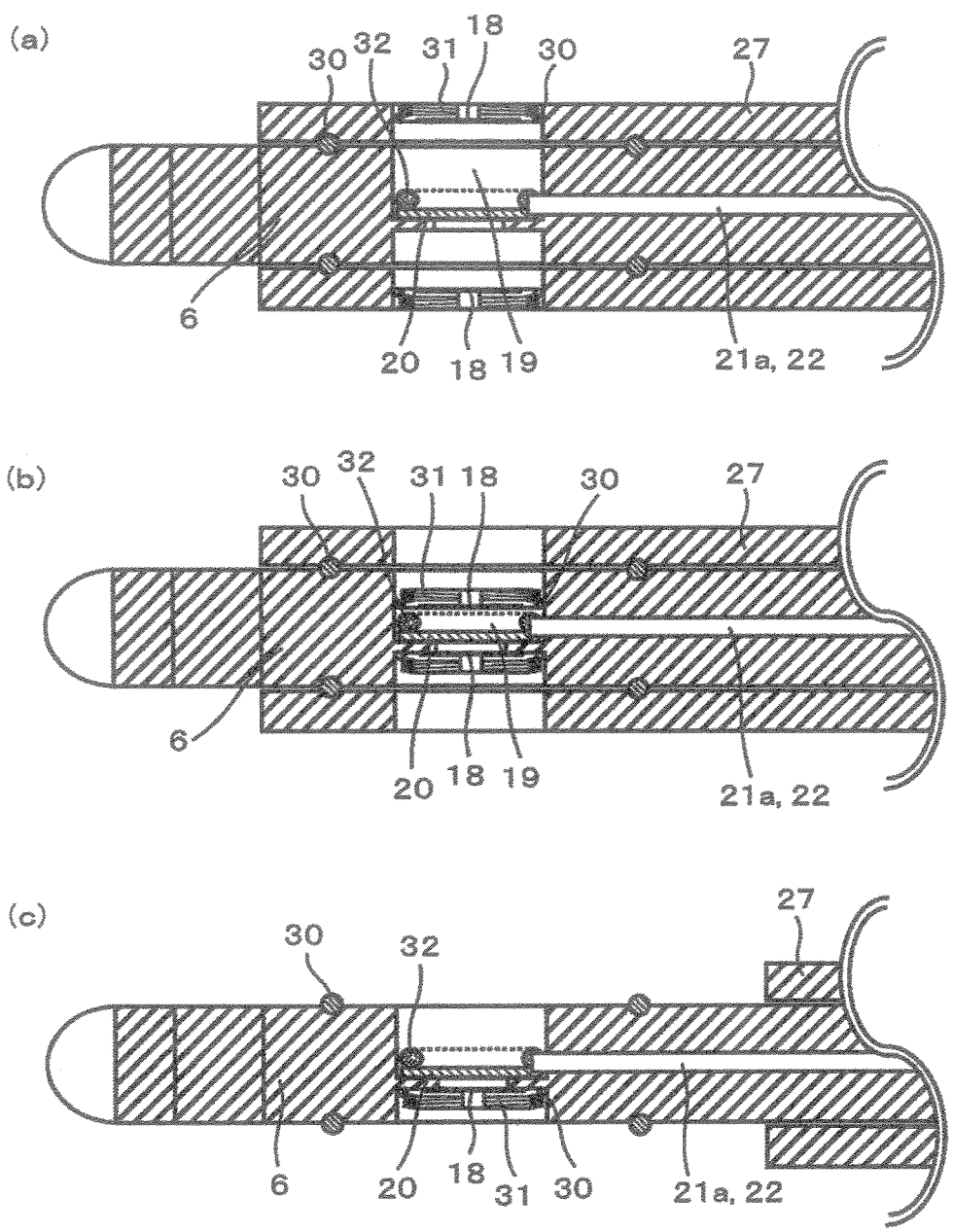
FIG. 5 is a distal end sectional view of a sample holding device 6 for an electron beam device according to an embodiment.

FIGS. 5 (a, b, c) illustrate the distal end sectional views of the sample holding device 6 (sample holder) for the electron beam device capable of moving the diaphragm 18 in the vertical direction according to one embodiment.

The diaphragm 18 is fixed to a support 31 and a screw is thread cut at a contact portion of the support 31 with the diaphragm operation portion 27. Therefore, the diaphragm 18 can move in the vertical direction (a).

The diaphragm 18 can be brought closer to the sample 20 by thread cutting the center portion of the main body of the sample holding device 6 for the electron beam device (b). In consequence, it becomes possible to reduce the gas volume to inhibit the scatter of the electron beams and to conduct a higher resolution observation.

Only the upper diaphragm 18 can be moved by setting the lower diaphragm 18 to the center of the main body of the sample holding device 6 for the electron beam device with respect to the sample 20 and setting the upper diaphragm 18 to the diaphragm driving unit 27. In consequence, it becomes possible to reduce the volume of the cell 19, to restrict the gas volume and to conduct the higher resolution observation when the cell 19 is sealed by the diaphragm 18. Exhaust of the cell 19 can be conducted in a short time after the reaction by moving the upper diaphragm 18 horizontally and releasing the cell 19, and a high resolution observation immediately after the reaction and higher sensitivity EDX and EELS analyses can be conducted (c).

Figure 6:
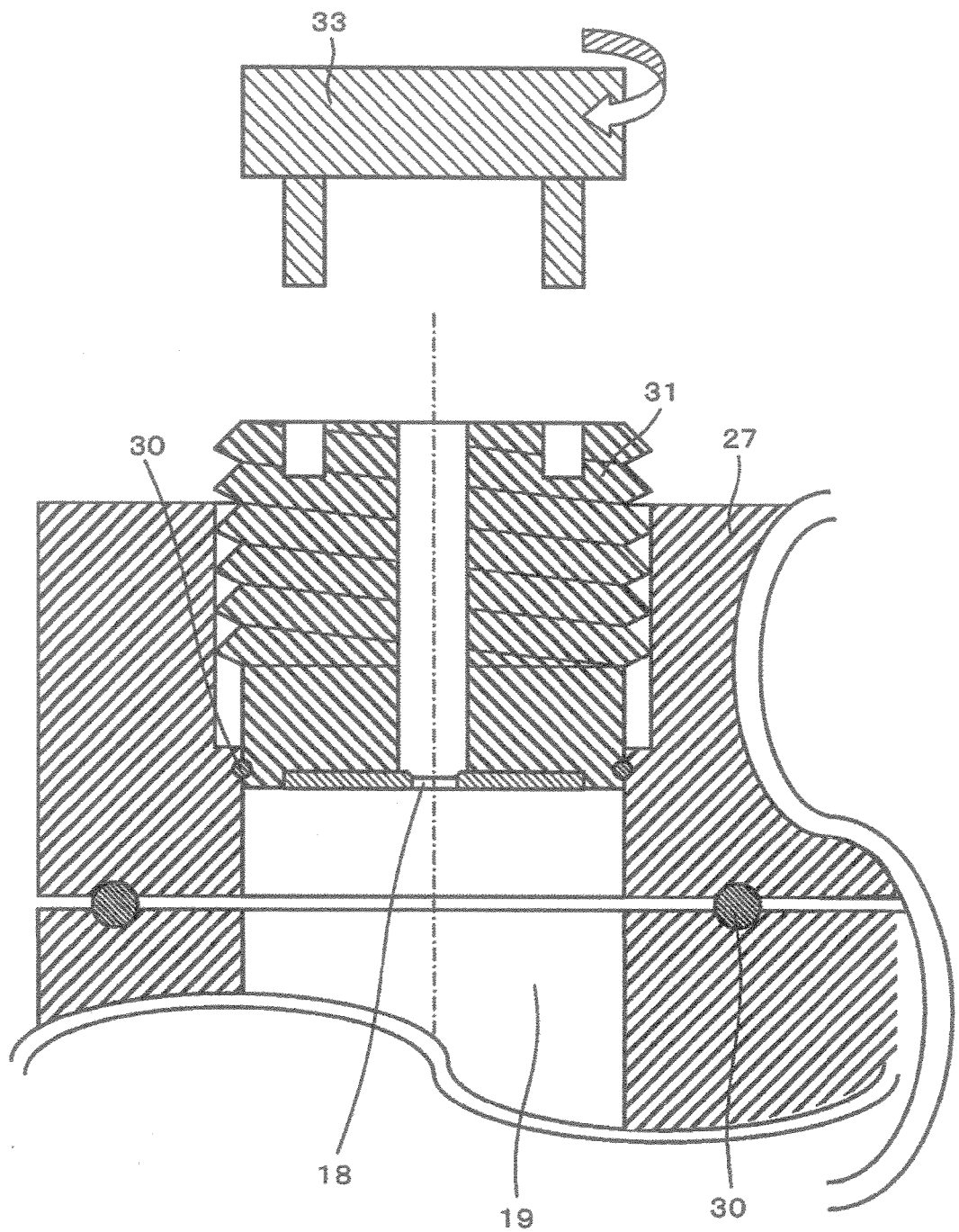
FIG. 6 is an explanatory view of the operation of the sample holding device 6 for an electron beam device according to an embodiment.

FIG. 6 illustrates an explanatory view of the case where the diaphragm 18 moves in the vertical direction. An O-ring 30 is fitted to the support 31 to which the diaphragm 18 is fixed, and isolates the inside of the cell 19 from outside. A specific driver 33 is used for the movement of the diaphragm 18. A protruding portion formed on the specific driver 33 is fitted into and rotate a hole formed in the support 31. Therefore, the support 31 having the diaphragm 18 fitted thereto is moved up and down.

A heating mechanism of the sample will be explained with reference to FIG. 7.

Figure 7:
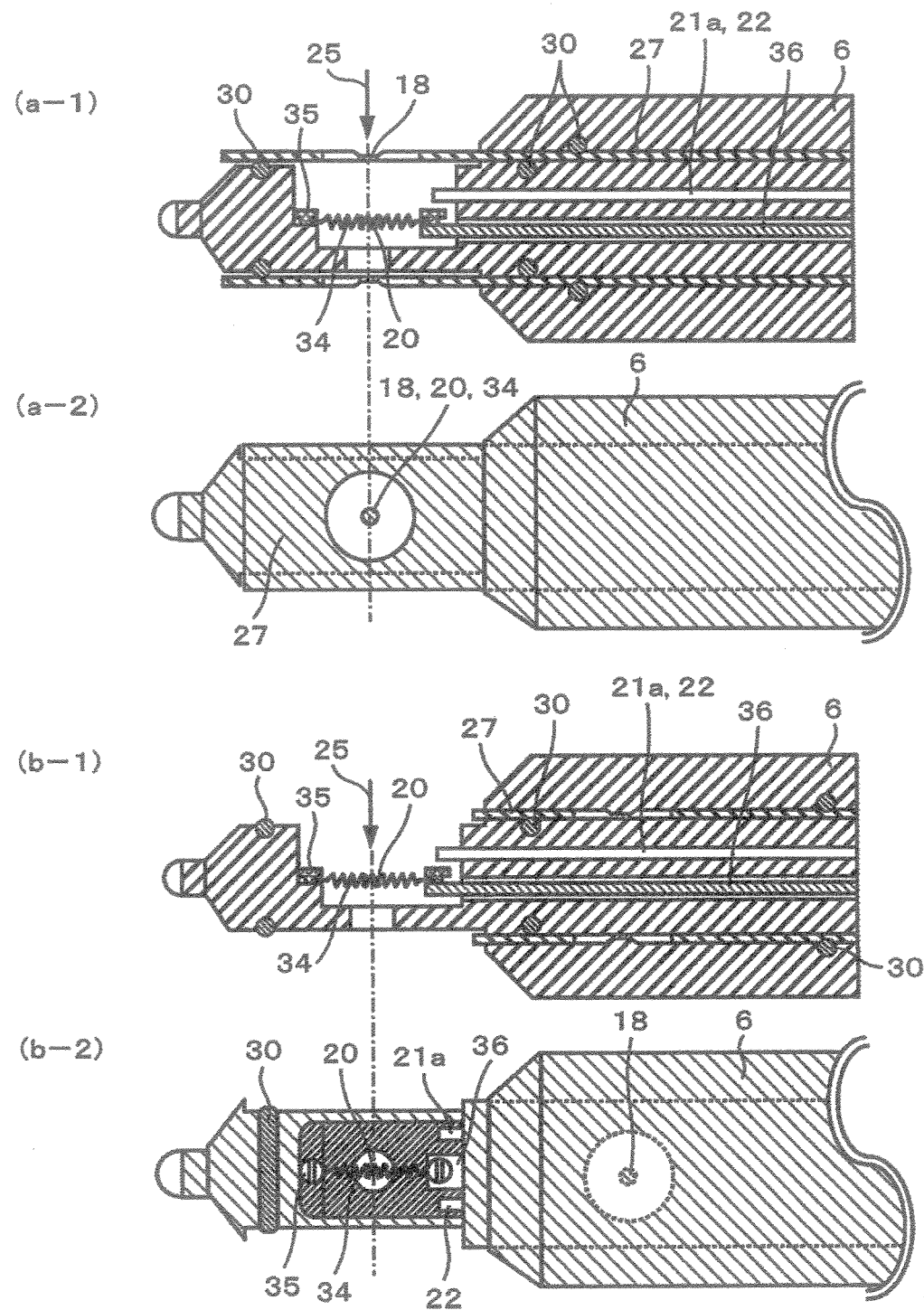
FIG. 7 is a sectional view and top view of a sample holding device 6 for an electron beam device according to an embodiment.

FIG. 7 illustrates a distal end sectional view (a-1, b-1) of a sample holding device 6 for an electron beam device and its distal end top view (a-2, b-2). A heater 34 is fixed by a screw 35 to the sample holding device 6 for the electron beam device inside the cell 19 of the sample holding device 6. The heater 34 is connected to a heating power source 37 outside the electron beam device 1 through a lead wire 36. The sample 20 is powder and adheres directly to the heater 34. The gas is introduced through the gas inlet pipe 21a into the sealed cell 19 and a current is thereafter caused to flow through the heater 34. As a result, the sample 20 is directly heated, the gas reaction takes place and its condition can be observed (a-1, a-2).

The gas is exhausted while the current is allowed to flow through the heater 34, the upper and lower diaphragms 18 are moved horizontally and the cell 19 is released. In this way, a high resolution observation of the sample 20 immediately after the reaction can be made inside the same visual field. Also, the EELS analysis can be made with high spatial resolution and with less influence of the diaphragm 18 when the analysis of a minute area is made by contracting the electron beams 25 (b-1, b-2).

Evaporation to a heated sample will be explained with reference to FIG. 8.

Figure 8:
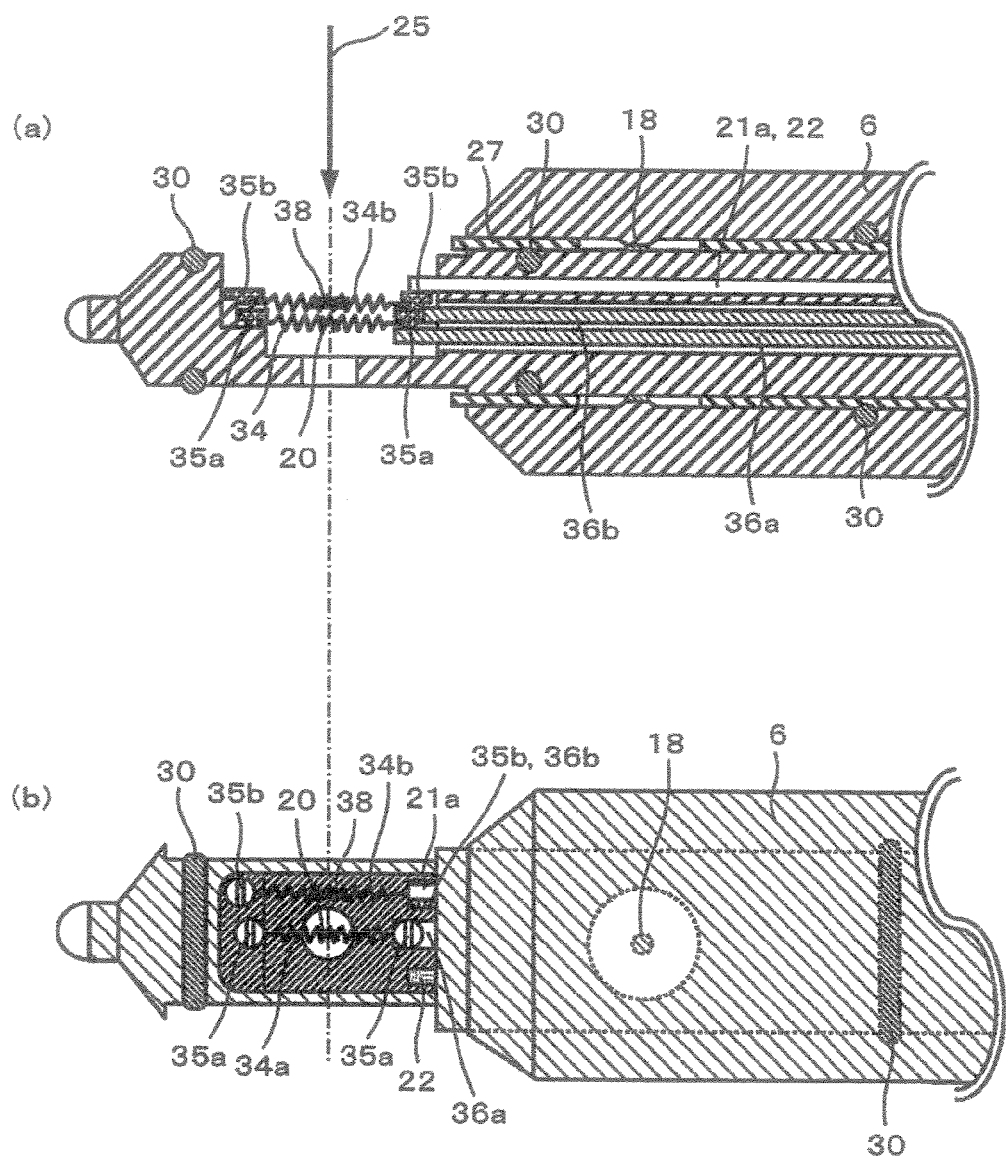
FIG. 8 illustrates a sample holding device 6 for an electron beam device in an embodiment, wherein (a) is a sectional view of the sample holding device 6 for the electron beam device and (b) is a top view of the sample holding device 6 for the electron beam device.

FIG. 8 illustrates a distal end sectional view (a) of a sample holding device 6 for the electron beam device and its distal end top view (b) according to an embodiment. Another evaporation heater 34b for evaporating a different metal to the sample 20 is fixed by a screw 35b to the distal end portion of the sample holding device 6 for the electron beam device besides the sample 20 and the heater 34a for heating. The evaporation heater 34b is installed inside the cell 19 sealed by the diaphragm 18. The evaporation heater 34b is connected to a lead wire 36b and is connected to a heating power source different from the power source for heating the sample 20 through the lead wires 36b. A metal 38 for evaporation directly adheres to the evaporation heater 34b. When the evaporation heater 34b is heated, the metal 38 for evaporation on the heater 34b is evaporated to the sample 20.

Figure 9:
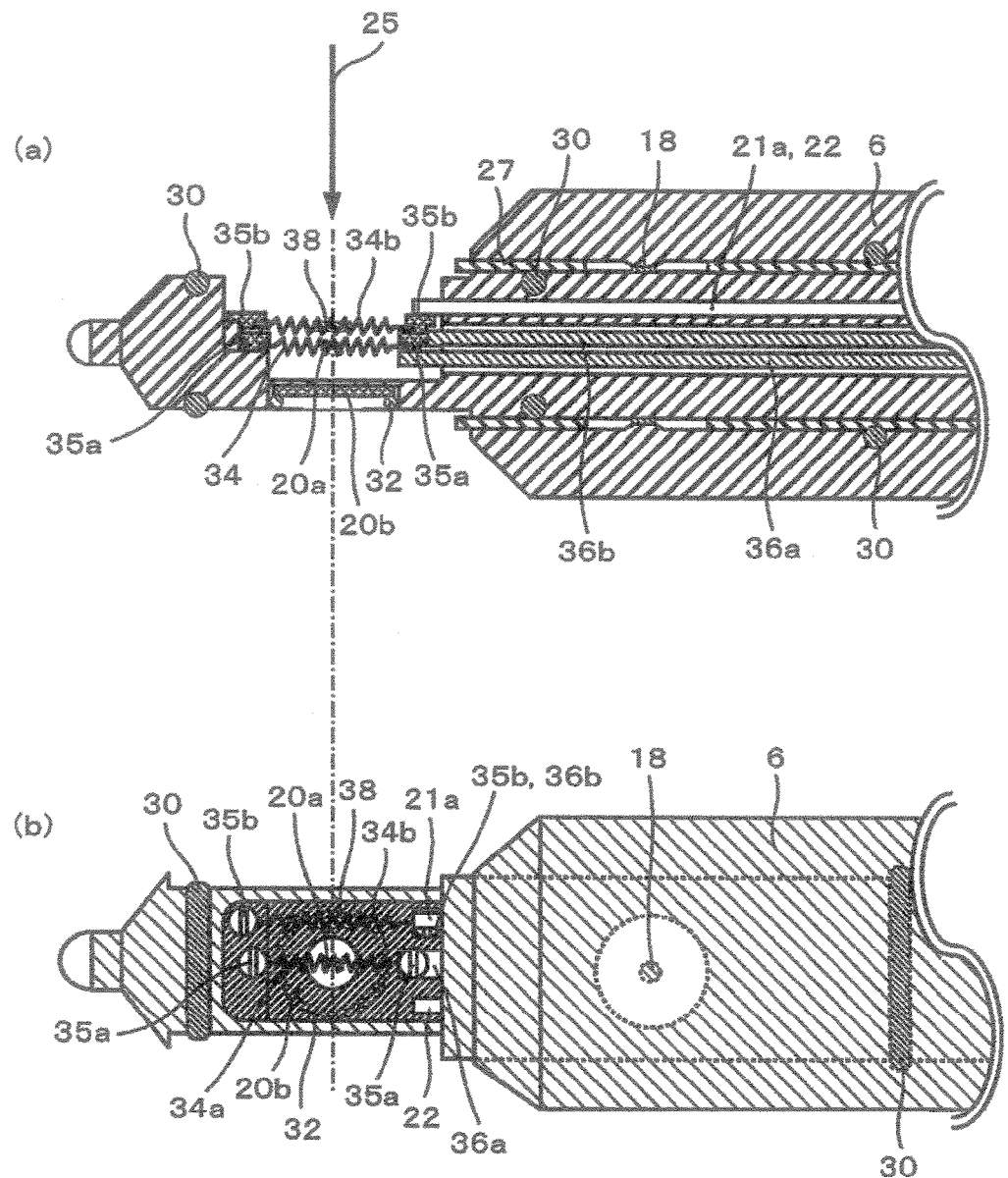
FIG. 9 illustrates a sample holding device 6 for an electron beam device according to an embodiment; (a) a sectional view of the sample holding device 6 for the electron beam device, and (b) a top view of the sample holding device 6 for the electron beam device.

FIG. 9 illustrates a distal end sectional view (a) of a sample holding device 6 for the electron beam device and its distal end top view (b) according to an embodiment. A sample 20b fixed to a grid having a diameter of about 3 mm or punched out into a disc having a diameter of about 3 mm is fitted to the distal end portion of the sample holding device 6 for the electron beam device besides the sample 20, the heater 34a for heating and the evaporation heater 34b. The sample 20b is fixed by a ring spring 32 inside the cell 19. Consequently, the heater 34a for heating can be used also as the evaporation source, and a different kind of evaporation source can be evaporated to the sample 20b. The sample 20b can be heated by utilizing radiation heat of the heater.

Figure 10:
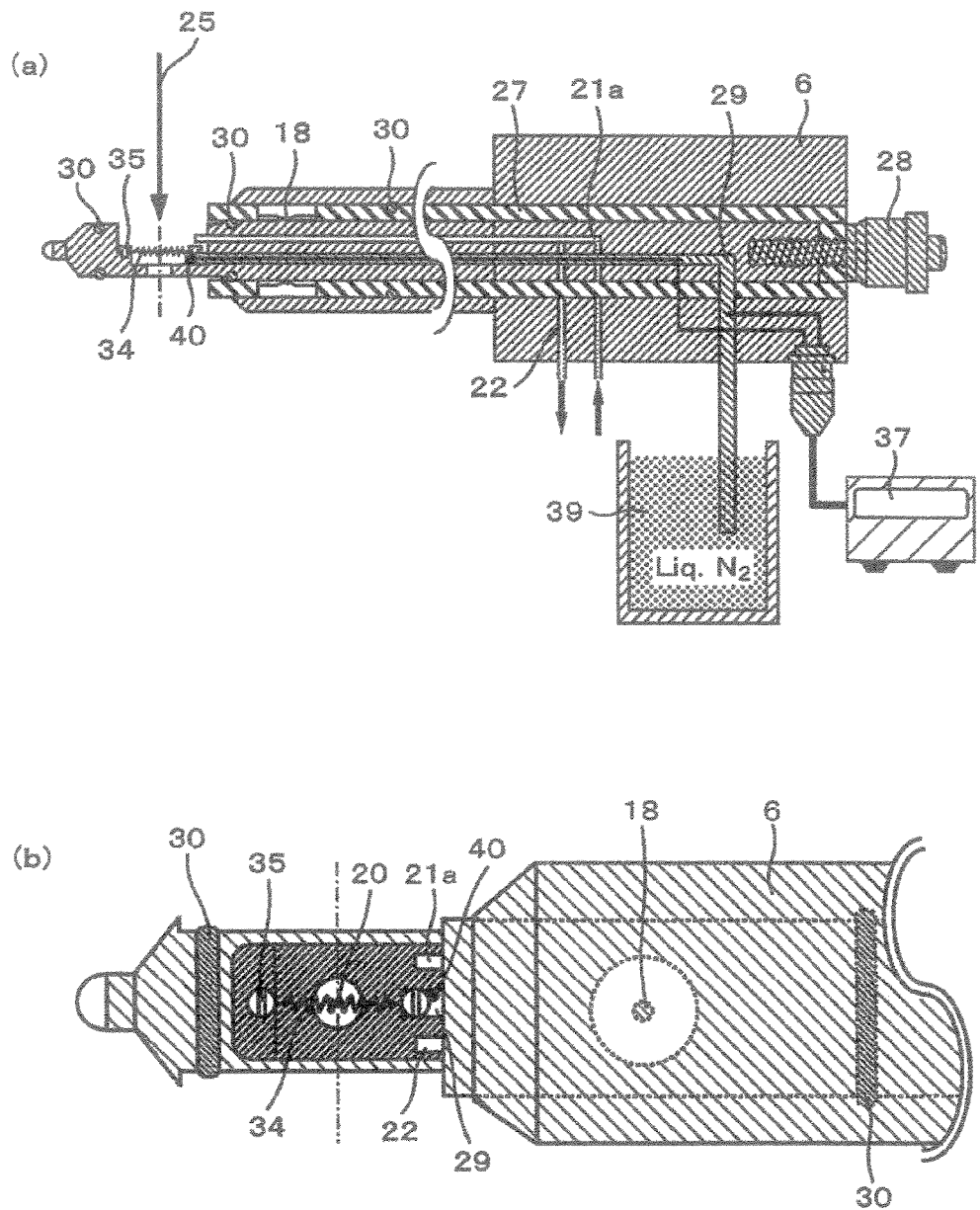
FIG. 10 illustrates a sample holding device 6 for an electron beam device according to an embodiment; (a) a sectional view of the sample holding device for the electron beam device, and (b) a top view of the sample holding device for the electron beam device.

FIG. 10 illustrates a distal end sectional view (a) of a sample holding device 6 for the electron beam device and its distal end top view (b) according to an embodiment. A sample 20 fitted to the distal end portion of the sample holding device 6 for the electron beam device, and the heater 34 for heating can be connected to the heating power source 37 and a liquid nitrogen storage unit 39 through a lead wire 36. A thermocouple 40 is arranged in the vicinity of the sample 20 to measure the temperature. The sample 20 is directly deposited to the heater 34. The sample 20 and the heater 34 can be cooled when they are connected to the liquid nitrogen storage unit 39 through a cooling rod 29. In this way, the reaction of the sample 20 can be observed over a wide temperature range.

An embodiment wherein a sample drift occurs owing to high temperature heating and cooling will be explained.

Figure 11:
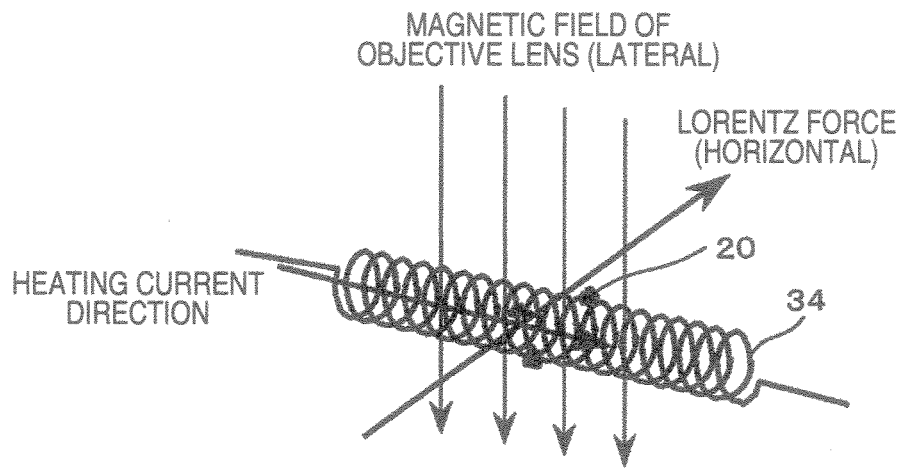
FIG. 11 is an explanatory view of a sample holding device 6 for an electron beam device according to an embodiment.

FIG. 11 is an explanatory view of the case where the sample is heated by using this embodiment.

When the sample holding device 6 for the electron beam device is set to the sample chamber 14 in the electron beam device 1, the heater 34 receives the Lorentz force in the horizontal direction from the direction of the heating current because the magnetic field of the objective lens 4 extends in the vertical direction.

Figure 12:
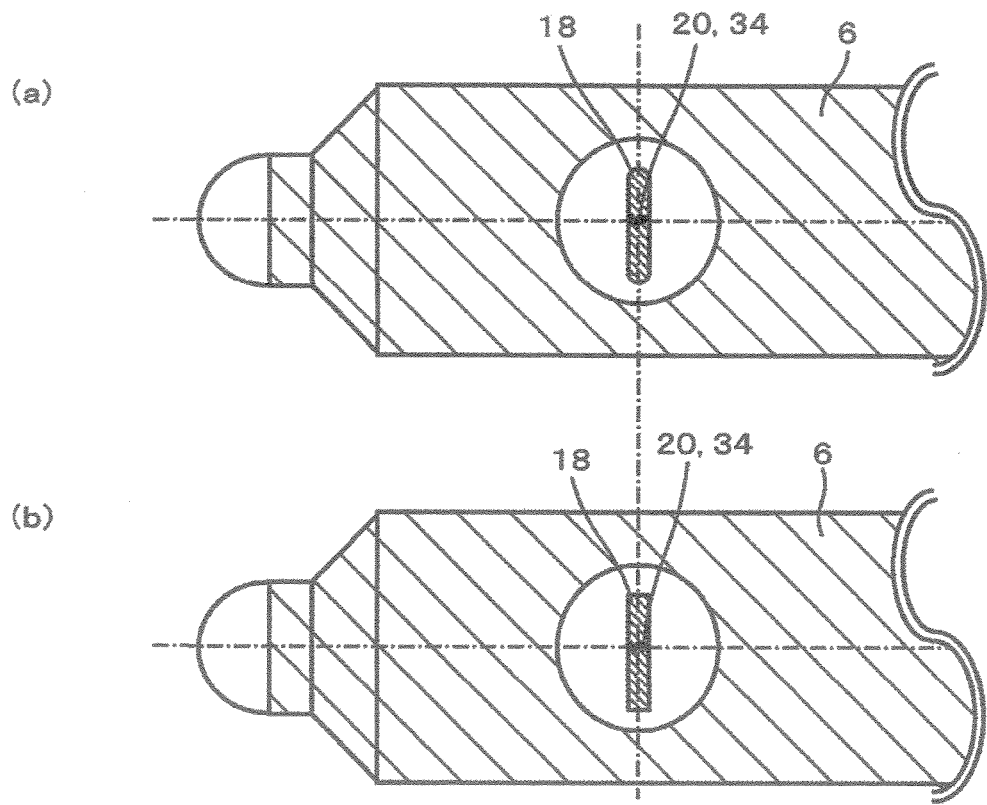
FIG. 12 illustrates a sample holding device 6 for an electron beam device according to an embodiment.

FIG. 12 illustrates a distal end top view of a sample holding device 6 for the electron beam device according to this embodiment. The diaphragm 18 of the sample holding device 6 for the electron beam device has an elliptic shape the major axis of which is coincident with the moving direction, or a rectangular shape. The moving direction of the heater 34 and the sample 20 during heating of the sample 20 is the horizontal direction from FIG. 11. Therefore, observation can be made smoothly without getting off from the visual field.

FIG. 13 illustrates a distal end sectional view (a) of a sample holding device 6 for the electron beam device and its distal end top view (b) according to an embodiment. A minute pressure gauge chip 41 is adapted to the main body of the sample holding device 6 for the electron beam device inside the cell 19 sealed by the diaphragm 18 and is connected to a pressure gauge 42 outside the electron beam device 1. In consequence, the pressure inside the cell 19 sealed by the diaphragm 18 can be measured directly.

Figure 14:
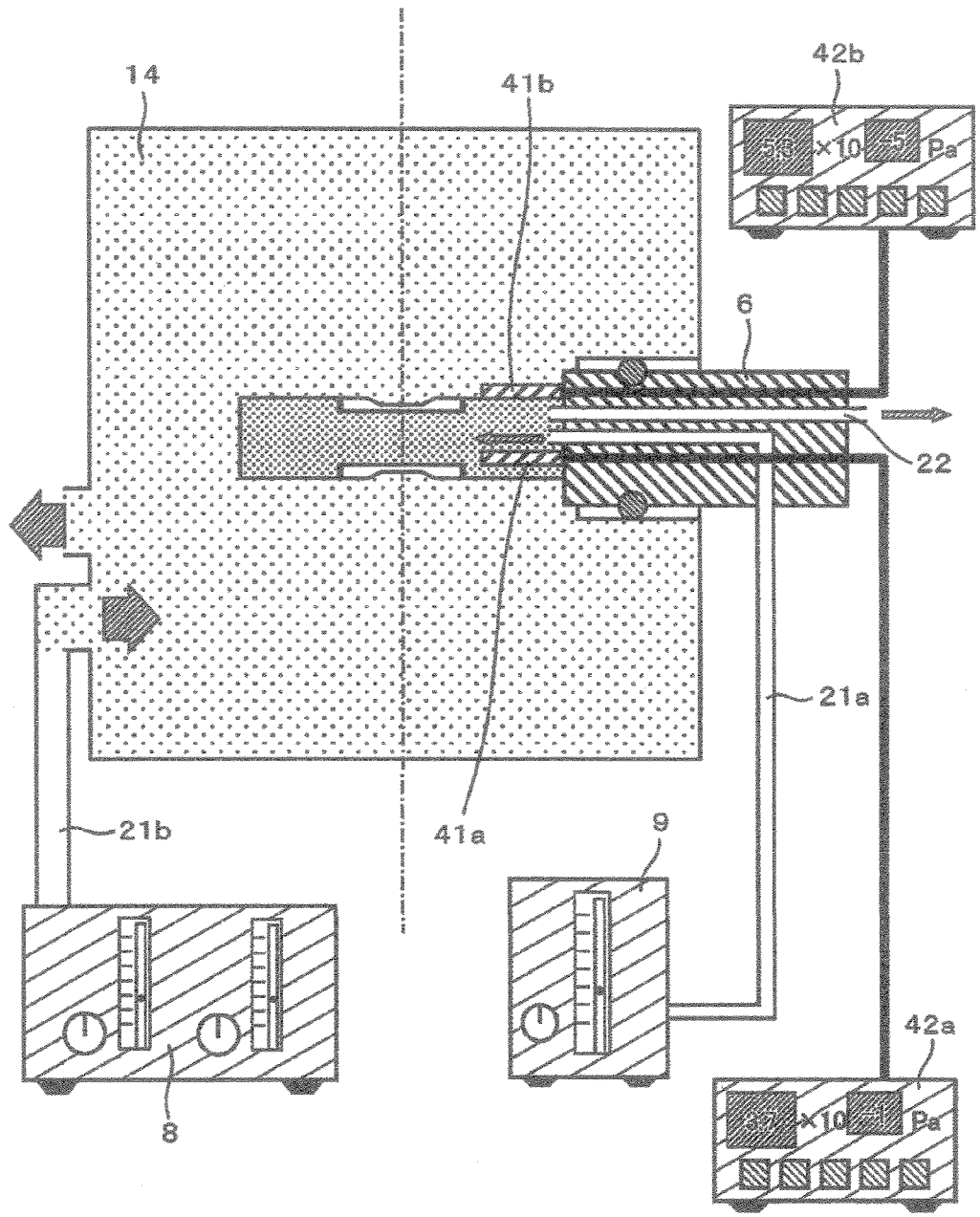
FIG. 14 is a structural view of an electron beam sample chamber 14 and a sample holding device 6 for an electron beam device according to an embodiment.

FIG. 14 illustrates an electron beam sample chamber 14 and a sample holding device 6 for the electron beam device according to an embodiment. The electron beam sample chamber 14 is disposed in the electron beam device 1 and has a structure such that the electron beams can pass through a central portion indicated by a center line. A minute pressure gauge chip 41a is adapted to the main body of the sample holding device 6 for the electron beam device inside the cell 19. Moreover, another minute pressure gauge chip 41b is adapted to the main body of the sample holding device 6 for the electron beam device outside the cell 19. The minute pressure gauge chip 41b is connected to a pressure gauge 42b. Accordingly, the pressure inside the electron beam sample chamber 14 in the vicinity of outside of the cell 19 can be measured besides the internal pressure of the cell 19.

Figure 15:
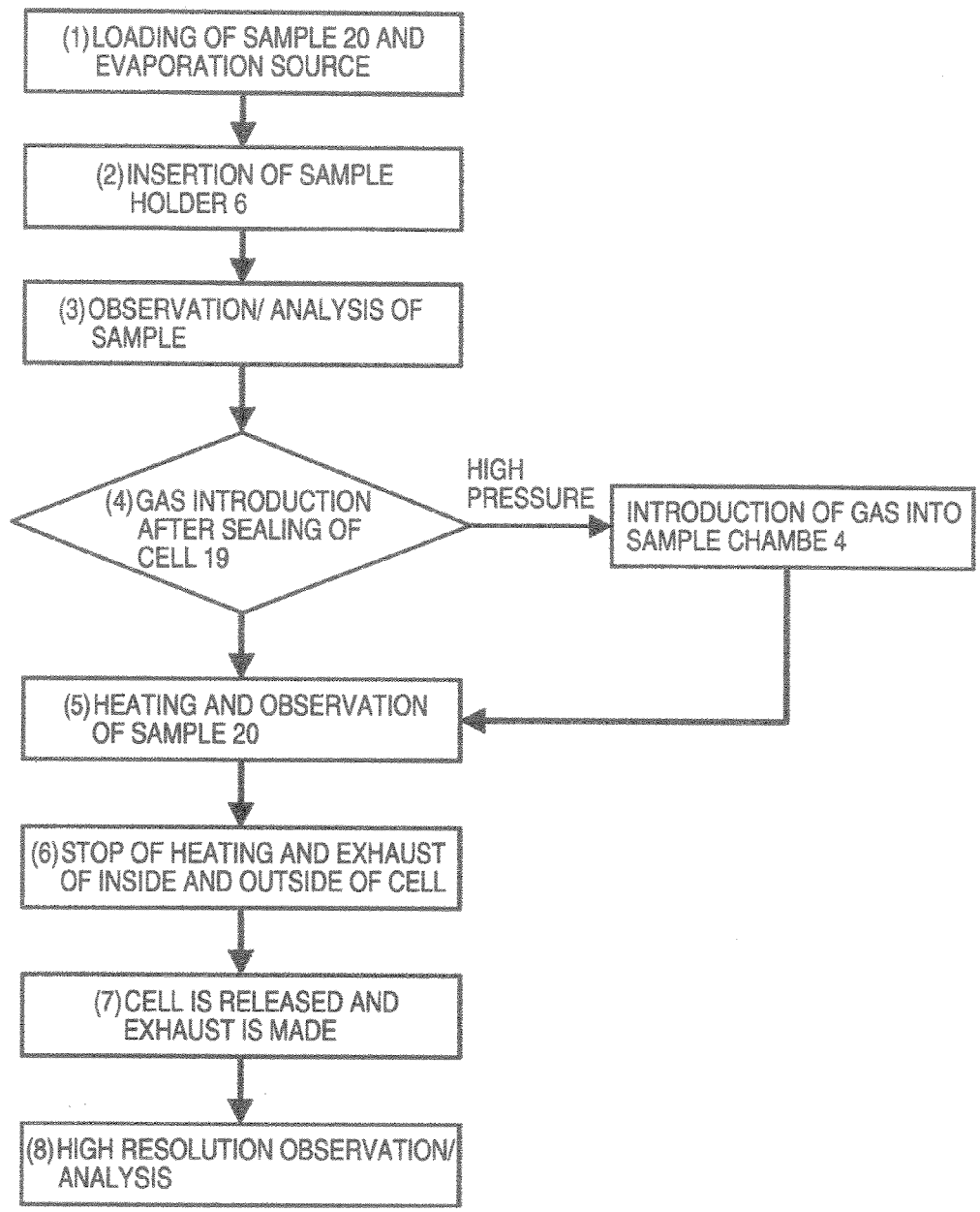
FIG. 15 is an explanatory view of the use of a sample holding device 6 for an electron beam device according to an embodiment.

FIG. 15 is an explanatory diagram for the use of the sample holding device 6 for the electron beam device in the embodiment illustrated in FIG. 7.

(1) The sample 20 is caused to adhere to the heating heater 34a. A different kind of evaporation metal 38 is caused to adhere to the evaporation heater 34b.

(2) The sample holding device 6 for the electron beam device is inserted into the electron beam sample chamber 14.

(3) The sample 20 is observed under the state where the diaphragm 18 does not exist. If necessary, EDX analysis and EELS analysis is carried out.

(4) The cell 19 is sealed by the diaphragm 18. A gas such as air is introduced and the pressure inside the cell 19 is set. When a possibility of the breakage of the diaphragm 18 due to a high pressure exists, the gas is introduced also to the outside of the cell 19, that is to say, into the electron beam sample chamber 14.

(5) The sample 20 is heated. The gas reaction of the sample with heating is observed and analyzed.

(6) Heating is stopped after the reaction.

(7) The diaphragm 18 is moved horizontally and the gas both inside and outside the cell 19 is exhausted.

(8) High resolution observation and analysis of the reaction product are conducted.

As described above, the reaction process in the gas atmosphere can be observed freely while the visual field of observation is kept without taking out the sample even once.

When the structures described above are combined, it becomes possible to precisely control the pressure inside the environmental cell, to observe the reaction process in a high pressure gas atmosphere or in a liquid, such as the crystal growing process by high temperature gas reaction, to observe the oxidation reduction reaction and organisms in a minute atmospheric space and to conduct high resolution observation and high sensitivity analysis immediately after the reaction in the high pressure gas atmosphere.

REFERENCE SIGNS LIST

1: electron beam device
2: electron gun
3: condenser lens
4: objective lens
5: projection lens
6: sample holding device for electron beam device
7: fluorescent plate
8: TV camera
9: image display unit
10: EELS detector
11: EELS control unit
12: EDX detector
13: EDX control unit
14: electron beam sample chamber
15: observation chamber
16: valve
17: vacuum pump
18: diaphragm
19: cell
20: sample
21: gas inlet pipe
22: gas exhaust pipe
23: gas pressure control valve
24: gas storage unit
25: electron beam
26: intermediate chamber
27: diaphragm driving unit
28: micrometer
29: cooling rod
30: O-ring
31: support
32: ring spring
33: specific driver
34: heater
35: screw
36: lead wire 37: heating power source
38: evaporation metal
39: liquid nitrogen storage unit
40: thermocouple
41: minute pressure gauge chip
42: pressure gauge

The invention claimed is:

1. An electron beam device comprising:
an electron source for emitting primary electron beams:
electron beam control means for condensing the electron beams emitted from said electron source and irradiating the electron beams to a sample;
a detector for detecting the electrons generated from said sample;
a control means for forming a sample image on the basis of signals from said detector;
a display means for displaying said sample image; and
a sample holding means for holding said sample in a sample chamber;
wherein said sample holding means includes a gas supply means for supplying a gas to said sample and an exhaust means for exhausting said gas;
wherein a cell is constituted in such a manner that diaphragms are arranged above and below said sample, an atmosphere of the gas and vacuum of said sample chamber are isolated and an atmosphere around said sample is sealed;
wherein a mechanism for spraying the gas is arranged outside said diaphragms and inside said sample chamber; and
wherein a gas layer having a pressure higher than vacuum is formed outside said diaphragms.

2. An electron beam device according to claim 1, wherein the material of said diaphragms is an amorphous film formed of a light element selected from a carbon film, an oxide film and a nitride film configured to transmit the electron beam.

3. An electron beam device according to claim 1, wherein both or either one of said diaphragms arranged above and below said sample has a mechanism configured to move in a horizontal direction.

4. An electron beam device according to claim 1, wherein said diaphragms arranged above and below said sample have a mechanism configured to move in a vertical direction.

5. An electron beam device according to claim 1, wherein a mechanism for heating said sample is arranged in said cell in such a manner that condition of said sample can be observed in a gas atmosphere during heating of said sample.

6. An electron beam device according to claim 1, wherein a micro pressure gauge is provided inside said cell.

7. A sample holding device for an electron beam device comprising:
an electron beam control means for condensing electron beams emitted from an electron source and irradiating the electron beams to a sample;
a detector for detecting the electrons generated from said sample;
a control means for forming a sample image on the basis of signals from said detector;
a display means for displaying said sample image; and
a sample holding means for holding said sample inside said sample chamber;
wherein said sample holding means comprises a gas supply means for supplying a gas to said sample and an exhaust means for exhausting said gas;
wherein a cell is constituted in such a manner that diaphragms are arranged above and below said sample, an atmosphere of a gas and vacuum of said sample chamber are isolated and an atmosphere around said sample is sealed;
wherein a mechanism for spraying a gas is arranged outside said diaphragms inside said sample chamber; and
wherein a gas layer having a pressure higher than vacuum is formed outside said diaphragms.

8. A sample holding device for the electron beam device according to claim 7, wherein the material of said diaphragms is an amorphous film formed of a light element selected from a carbon film, an oxide film and a nitride film configured to transmit the electron beam.

9. A sample holding device for an electron beam device according to claim 7, wherein said diaphragms arranged above and below said sample have a mechanism configured to move in a horizontal direction.

10. A sample holding device for an electron beam device according to claim 7, wherein said diaphragms arranged above and below said sample have a mechanism configured to move in a vertical direction.

11. A sample holding device for an electron beam device according to claim 7, wherein a mechanism for heating said sample is arranged in said cell so that condition of said sample can be observed in a gas atmosphere during heating of said sample.

12. A sample holding device for an electron beam device according to claim 7, wherein a micro pressure gauge provided inside said cell.

* * * * *